US012783766B2

(12) United States Patent
El-Zein et al.

(10) Patent No.: US 12,783,766 B2
(45) Date of Patent: Nov. 3, 2026

(54) VERIFYING MULTI-CYCLE INTERCONNECT SYNTHESIS OPTIMIZATION IN AUTOMATICALLY GENERATED PHYSICAL HIERARCHY CHIP DESIGN

(71) Applicant: International Business Machines Corporation, Armonk, NY (US)

(72) Inventors: Ali S. El-Zein, Austin, TX (US); Viresh Paruthi, Austin, TX (US); Gabor Bobok, Adirondack, NY (US); Lakshmi N. Reddy, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 599 days.

(21) Appl. No.: 18/488,081

(22) Filed: Oct. 17, 2023

(65) Prior Publication Data

US 2025/0124202 A1 Apr. 17, 2025

(51) Int. Cl.
*G06F 30/33* (2020.01)
*G06F 30/337* (2020.01)
*G06F 30/398* (2020.01)

(52) U.S. Cl.
CPC ............ *G06F 30/33* (2020.01); *G06F 30/337* (2020.01); *G06F 30/398* (2020.01)

(58) Field of Classification Search
CPC .... G06F 30/30; G06F 30/327; G06F 30/3323; G06F 30/33; G06F 30/337; G06F 30/398; G06F 2119/12; G06F 30/394; G06F 30/343; G06F 30/347; G06F 30/357
USPC ........................................................ 716/100
See application file for complete search history.

(56) References Cited

U.S. PATENT DOCUMENTS

| | | | |
|---|---|---|---|
| 10,146,898 | B1 | 12/2018 | Brugada et al. |
| 10,565,338 | B2 | 2/2020 | El-Zein et al. |
| 10,885,249 | B1 | 1/2021 | Kollesar et al. |
| 10,891,411 | B2 | 1/2021 | Nam et al. |
| 11,074,379 | B2 | 7/2021 | Reddy et al. |
| 11,361,133 | B2 | 6/2022 | Denisenko |

(Continued)

OTHER PUBLICATIONS

Agnesina et al., "Hier-3D: A Hierarchical Physical Design Methodology for Face-To-Face-Bonded 3D ICs," ISLPED '22, Aug. 1-3, 2022, 6 pages.

(Continued)

*Primary Examiner* — Paul Dinh
(74) *Attorney, Agent, or Firm* — CANTOR COLBURN LLP; Edward Wixted

(57) ABSTRACT

A method for verifying Multi-Cycle Interconnect Synthesis (MCIS) optimization in an automatically generated physical hierarchy chip design, the method includes introducing a logical hierarchy to a Hierarchy Manipulation Tool (HMT) to automatically generate a physical chip design, wherein the physical chip design includes a logical hierarchy an a physical hierarchy, optimizing the physical chip design to develop an optimized physical chip design, processing the optimized physical chip design to account for forward annotation and to generate a modified physical chip design, processing the logical hierarchy to account for backward annotation and to generate a modified logical hierarchy and verifying that the modified logical hierarchy and the modified physical chip design are consistent with each other.

20 Claims, 7 Drawing Sheets

(56) References Cited

U.S. PATENT DOCUMENTS

| | | | |
|---|---|---|---|
| 2014/0298281 | A1 | 10/2014 | Varadarajan et al. |
| 2017/0011139 | A1 | 1/2017 | Arts et al. |
| 2021/0390242 | A1 | 12/2021 | Dabare et al. |
| 2022/0019720 | A1 | 1/2022 | Bhunia et al. |
| 2022/0263925 | A1 | 8/2022 | Janac et al. |
| 2022/0277123 | A1 | 9/2022 | Van Antwerpen et al. |
| 2023/0070516 | A1 | 3/2023 | El-Zein et al. |
| 2024/0303401 | A1* | 9/2024 | Saha ....................... G06F 30/27 |

OTHER PUBLICATIONS

Cong et al. "Architecture and Synthesis for On-Chip Multi-Cycle Communication," IEE Transactions on Computer-Aided Design of Integrated Circuits and Systems, vol. X, No. Y, Apr. 2004, pp. 1-14.

El-Zein et al., "Automated Physical Hierarchical Generation: Tools and Methodology," IBM Systems and Technology Group, 2018, 10 pages.

Kahng et al., "Hier-RTLMP: A Hierarchical Automatic Macro Placer Large-Scale Complex IP Blocks," arXiv:2304.11761v1, Apr. 23, 2023, pp. 1-14.

Rodionov et al., "Synchronization Constraints for Interconnect Synthesis," FPGA '17, Feb. 22-24, 2017, pp. 95-104.

* cited by examiner

VERIFYING MULTI-CYCLE INTERCONNECT SYNTHESIS OPTIMIZATION IN AUTOMATICALLY GENERATED PHYSICAL HIERARCHY CHIP DESIGN

BACKGROUND

The present invention generally relates to an automatically generated physical hierarchy chip design, and more specifically, to a system and method for verifying multi-cycle interconnect synthesis optimization in an automatically generated physical hierarchy chip design.

As semiconductor chips (chips) become more populated with components and thus, denser, modern hardware chip designs typically apply a hierarchical approach with functionality encapsulated as nodes in a hierarchy arrangement, wherein the hierarchy arrangement includes a logical hierarchy and a physical hierarchy. Unfortunately, however, the logical hierarchy may not map optimally to a two dimensional layout solution as the logical hierarchy does not consider layout information, such as area and routing constraints. Efforts in automatically mapping logical hierarchy to physical hierarchy have failed due to the difficulty in performing pin optimization, pin cloning, early power estimation, and many other aspects. Moreover, in large designs, some wires need to travel over very long distances, and thus over multiple clock cycles. This is further complicated by the fact that the hierarchy transformation can be applied multiple times and possibly on different levels of hierarchy.

SUMMARY

A method for verifying Multi-Cycle Interconnect Synthesis (MCIS) optimization in an automatically generated physical hierarchy chip design, the method includes introducing a logical hierarchy to a Hierarchy Manipulation Tool (HMT) to automatically generate a physical chip design, wherein the physical chip design includes a logical hierarchy and a physical hierarchy, optimizing the physical chip design to develop an optimized physical chip design, processing the optimized physical chip design to account for forward annotation and to generate a modified physical chip design, processing the logical hierarchy to account for backward annotation and to generate a modified logical hierarchy and verifying that the modified logical hierarchy and the modified physical chip design are consistent with each other.

Embodiments of the invention are also directed to computer-implemented methods and computer program products having substantially the same features and functionality as the computer system described above.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
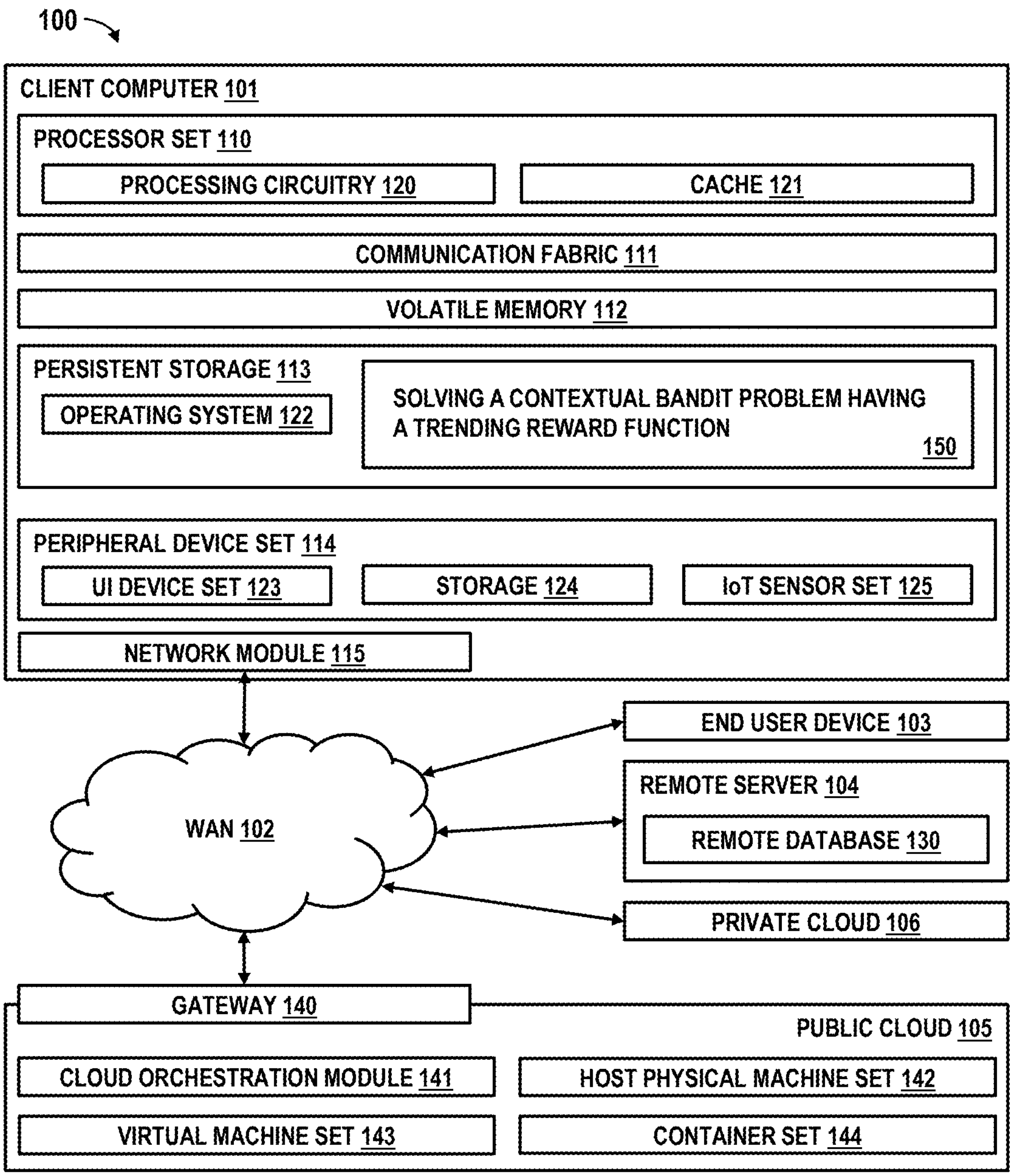
FIG. 1 shows a block diagram of an example computer system for use in accordance with one or more embodiments of the present invention.

As discussed briefly above, the present invention relates to a system and method for verifying multi-cycle interconnect synthesis optimization in an automatically generated physical hierarchy chip design. At the integration level or in large designs, some wires need to travel very long distances over multiple clock cycles. The method of the invention allows for efficient multi-cycle latch trees that synthesize such wires to be built that will satisfy given constraints using a specified number of clock cycles, as well as available routing layers.

It should be appreciated that some terms which will be used in this application are defined immediately below and include the terms atomic blocks, Hierarchy manipulation, Recipe file, Logical hierarchy, Physical hierarchy and top level hierarchy interface. Atomic blocks refer to design modules at low levels of hierarchy that cannot be broken up into smaller pieces, such as combinational logic and latches are atomic blocks. These design modules are optimized by logic synthesis and cannot be split by hierarchy manipulation. The term "wrappers" refers to a plurality of these modules that are integrated together at higher levels of hierarchy. These units may be large synthesizable objects, units, and/or chiplets. The term Hierarchy manipulation refers to a tool that takes a logical hierarchy and, under a set of instructions grouped under a recipe file, creates a physical hierarchy. The term Recipe file refers to a set of instructions that tells a hierarchy manipulation how to generate a physical hierarchy from an object (e.g., design module) in a logical hierarchy. The recipe file has instructions such as, but not limited to, moving an instance of a design module from a first unit in a logical hierarchy to a first unit in a physical hierarchy, flattening a particular hierarchy, creating a new unit and cloning (copying) an instance of an atomic block or unit.

The term Logical hierarchy refers to the design VHDL, or VHSIC Hardware Description Language (where VHSIC is an acronym for Very High-Speed Integrated Circuits), which may be written by a design team. The logical hierarchy may be organized by function or ownership. Logical hierarchy is without regard to physical layout, and, to a certain extent, timing, or power considerations. Logical hierarchy is typically a purely functional design and is what a verification team spends most of its resources on. A verification team provides switching activity at ports of the logical hierarchy to prove the logical hierarchy provides a correct implemented function. In the logical hierarchy it makes sense to group things in units such as an IFU (instruction fetch unit), a VSU (vector scalar unit), or an LSU (load store unit). The term Physical hierarchy refers to maintaining the function of the logical hierarchy but reorganized for the needs of the physical design. In a physical hierarchy, physical proximity and not functionality dictates what structures should be placed close to each other, so it makes sense to take parts of different units and place them together in new wrappers.

It should be appreciated that a top level hierarchy interface (ports) does not change between a top level logical hierarchy and a corresponding top level physical hierarchy. Therefore, if a top level port is reached, switching activity for that port is known from switching activity on that port in the simulation of the logical hierarchy. It should be further appreciated that an NDB (name database) contains a record of all transforms that a HM (hierarchy manipulation) has applied when creating the physical hierarchy and enables translation of names between the logical hierarchy and physical hierarchy. And, because hierarchy manipulation may be done in many separate and multiple steps, the NDBs from all the hierarchy manipulation runs may be merged to provide end-to-end translation between the logical hierarchy and the final physical hierarchy.

In accordance with an embodiment, the method of the invention includes preforming a hierarchy manipulation using a Hierarchy Manipulation Tool (HMT). A set of logical hierarchy functional verifications are introduced to the HMT which processes the logical hierarchy functional verifications responsive to a set of predetermined design constraints or rules to develop a physical hierarchy physical design. A variable latency manipulation function is then performed on the physical hierarchy physical design to optimize the physical design and to develop a modified physical hierarchy physical design having forward annotation. Once the modified physical hierarchy physical design is developed, the logical hierarchy functional verifications are introduced to the HMT which processes the logical hierarchy functional verifications responsive to a set of predetermined design constraints or rules to optimize the logical hierarchy and to develop modified logical hierarchy functional verifications which includes back annotation. At this point, the modified logical hierarchy functional verifications are processed responsive to a set of predetermined design constraints to map the modified logical hierarchy functional verifications to the modified physical hierarchy physical design.

Various aspects of the present disclosure are described by narrative text, flowcharts, block diagrams of computer systems, and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as for solving a contextual bandit problem having a trending reward function 150. In addition to block 150, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 150, as identified above), peripheral device set 114 (including user interface (UI), device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 150 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in block 150 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collects and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

One or more embodiments described herein can utilize machine learning techniques to perform tasks. More specifically, one or more embodiments described herein can incorporate and utilize rule-based decision making and artificial intelligence (AI) reasoning to accomplish the various operations described herein, namely containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

ANNs can be embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons that can be activated by the pixels of an input image. After being weighted and transformed by a function determined by the network's designer, the activation of these input neurons are then passed to other downstream neurons, which are often referred to as "hidden" neurons. This process is repeated until an output neuron is activated. The activated output neuron determines which character was input. It should be appreciated that these same techniques can be applied in the case of containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Figure 2:
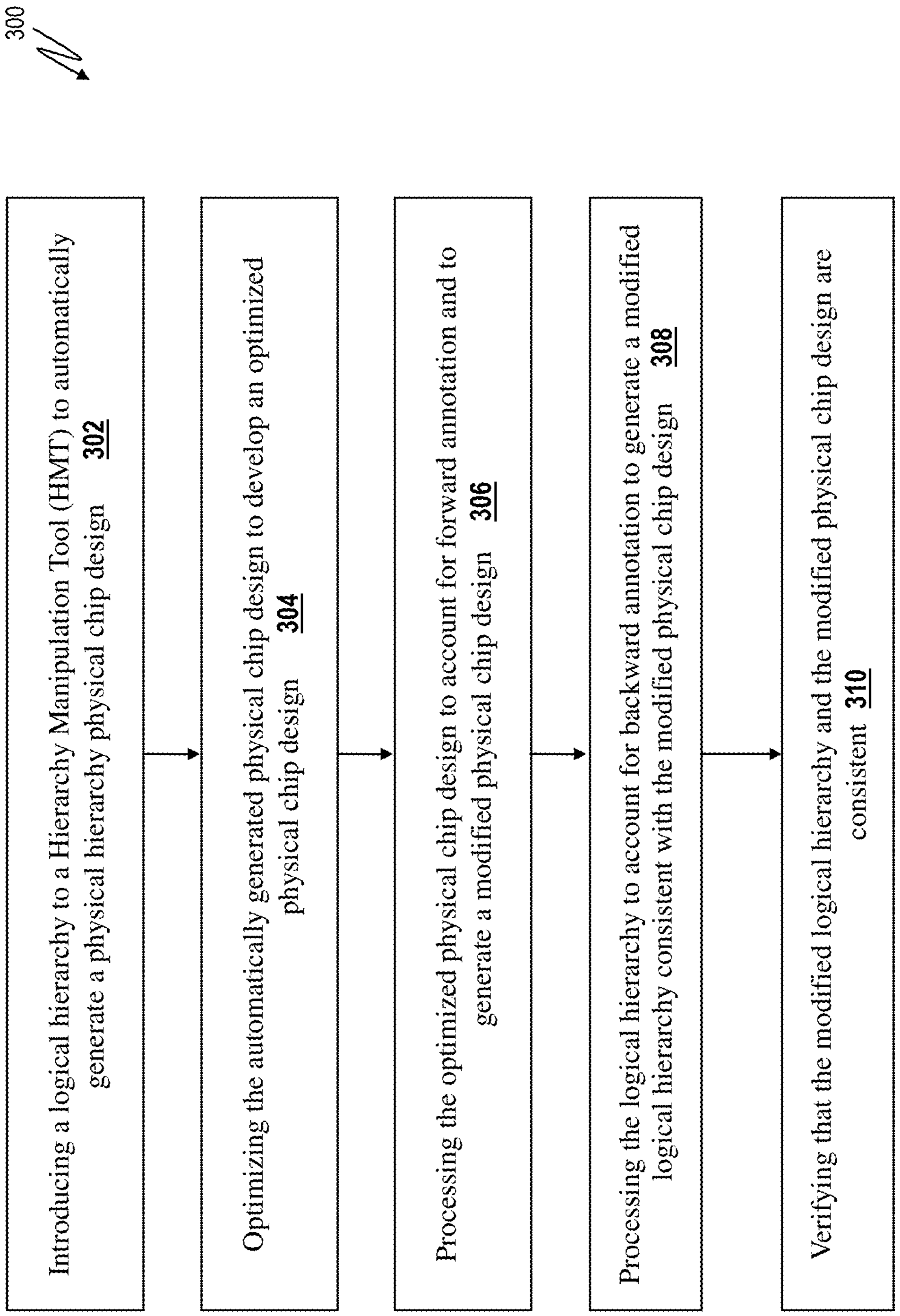
FIG. 2 is an operational block diagram illustrating a method for verifying Multi-Cycle Interconnect Synthesis optimization in an automatically generated physical hierarchy chip design includes performing a hierarchy manipulation using a Hierarchy Manipulation Tool (HMT) on an automatically generated physical hierarchy chip design, in accordance with one or more embodiments of the present invention.

In accordance with an embodiment, a method for verifying Multi-Cycle Interconnect Synthesis (MCIS) optimization in an automatically generated physical hierarchy chip design is provided, as shown in FIG. 2. The method 300 includes introducing a logical hierarchy to a Hierarchy Manipulation Tool (HMT) 202 to automatically generate a physical hierarchy physical chip design, as shown in operational block 302. This may be accomplished by introducing a logical wrapper 204 of a top level logical hierarchy 203, which includes instructions that determine the overall operation of a semi-conductor chip, to the HMT 202, wherein the HMT 202 processes the logical wrapper 204 to generate a physical chip design having a physical hierarchy based on a recipe file 208 which includes a set of instructions that guides the HMT 202 on how to generate the physical hierarchy from the logical wrapper 204.

Figure 3:
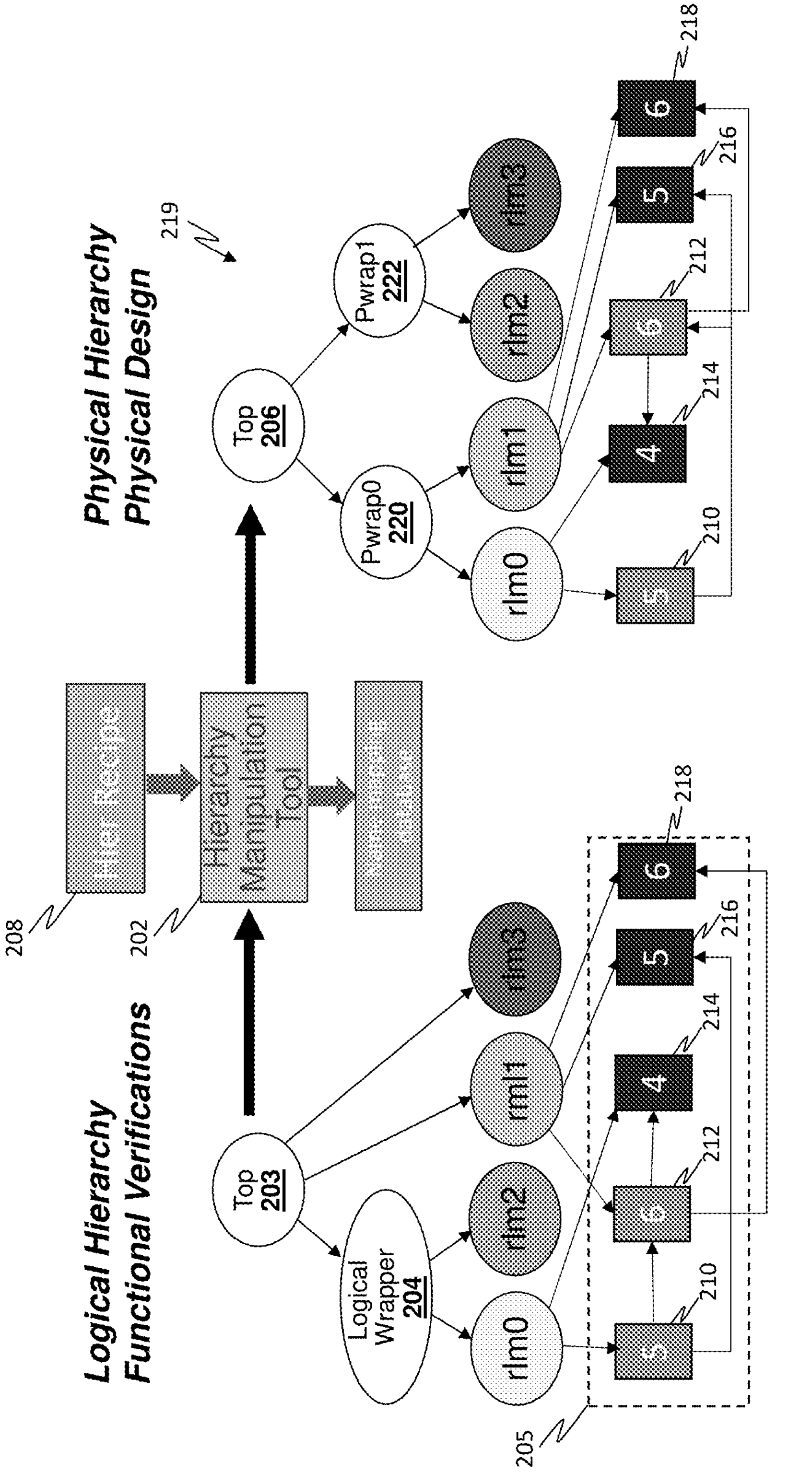
FIG. 3 is a function block diagram illustrating a logical hierarchy being processed to generate a physical hierarchy physical design, in accordance with one or more embodiments of the present invention.

FIG. 3 illustrates one example of a top level logical hierarchy 203 which includes one logical wrapper 204, a first design module rlm1, a second design module rlm2, a third design module rlm3 and a fourth design module rlm4, wherein the logical wrapper 204 includes the fourth design module rlm0 and the second design module rlm2. The top level logical hierarchy 203 includes switching instructions for a plurality of flip-flops (FF) 205 for carrying out the design of the top level logical hierarchy 203, where, in this example, these switching instructions are passed down to the design modules directly and through the logical wrapper 204. In this example, switching instructions are passed to the fourth design module rlm0 and the second design module rlm2 through the logical wrapper 204 and switching instructions are passed directly to the first design module rlm1 and third design module rlm3. As shown, the top level logical hierarchy includes instructions for a first source FF 210, a second source FF 212, a first sink FF 214, a second sink FF 216 and a third sink FF 218. The top level logical hierarchy 203 is configured such that logical wrapper 204, the first design module rlm1 and the third design module rlm3 receive switching instructions from the top level logical hierarchy 203.

The logical wrapper 204 passes the received switching instructions to the fourth design module rlm0 which passes the switching instructions to the first source FF 210 and the first sink FF 214. The top level hierarchy passes switching instructions to the first design module rlm1 which passes the received switching instructions to the second source FF 212, the second sink FF 216 and the third sink FF 218. Moreover, the first source FF 210 passes the received switching instructions to the second sink FF 216 and the second source FF 212, wherein the second source FF 212 further passes the received switching instructions to the first sink FF 214 and the third sink FF 218.

Once the top level logical hierarchy 203 is introduced to the HMT 202, the HMT 202 processes the top level logical hierarchy 203 based on rules from the recipe file 208 to generate a physical chip design 219 which follows a physical hierarchy. As can be seen, in this example, the HMT 202 generated a physical design 219 which configured the contents of the top level logical hierarchy 203 into a top level physical hierarchy 206 having a first physical wrapper 220 and a second physical wrapper 222. The top level physical hierarchy 206 is configured to pass the switching instructions to a first physical wrapper 220 which includes the switching instructions for the fourth design module rlm0 and the first design module rlm1 and the second physical wrapper 222 which includes the switching instructions for the second design module rlm2 and the third design module rlm3. The fourth design module rlm0 is configured to pass the switching functions to the first source FF 210 and the first sink FF 214. In turn, the first source FF 210 passes the switching functions to the second source FF 212 and the second sink FF 216. The first design module rlm1 passes the switching functions to the second source FF 212, the second sink FF 216 and the third sink FF 218. In turn, the second source FF 212 passes the switching functions to the third sink FF 218.

Figure 4:
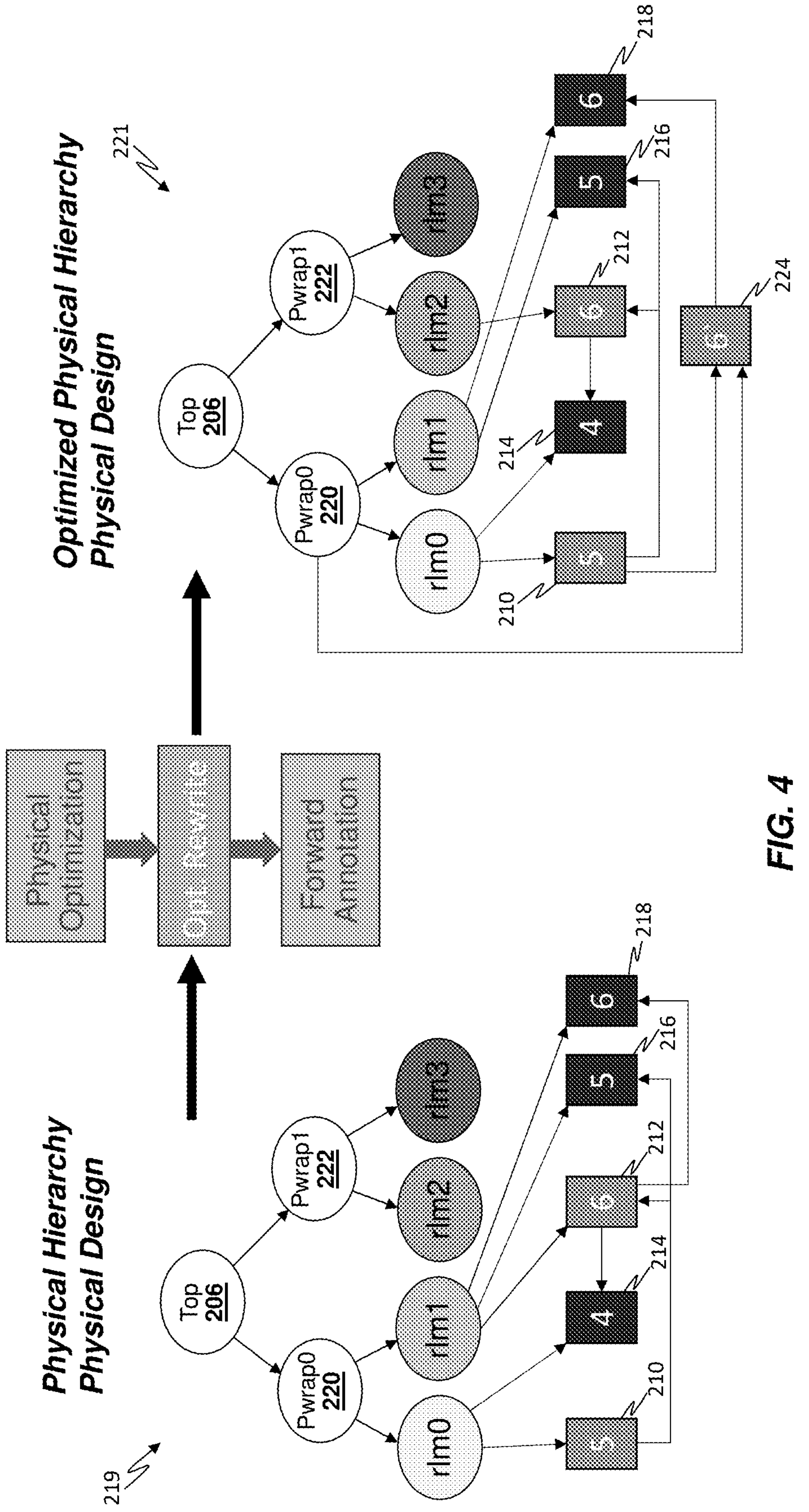
FIG. 4 is a function block diagram illustrating a physical hierarchy physical design being processed to generate a modified physical hierarchy physical design with no forward annotation, in accordance with one or more embodiments of the present invention.

Referring to FIG. 4, the method 300 includes processing the physical design 219 to optimize the physical design and to generate an optimized physical design 221 which satisfies the logical hierarchy, as shown in operational block 304. This may be accomplished by optimizing the physical design to build efficient multi-cycle latch trees to synthesize the wires that must travel long distances over multiple clock cycles and to satisfy the given physical constraints using a pre-specified number of cycles and available routing layers. As such, a variable latency manipulation function is performed on the physical hierarchy physical design 219 to generate the optimized physical design 221 which is consistent with the logical hierarchy functional design.

In this example, the optimized physical design 221 generated by performing a variable latency manipulation function is shown, wherein the optimized physical design 221 includes a third source FF 224 and wherein the instructions of the top level physical hierarchy 206 is configured into the first physical wrapper 220 and the second physical wrapper 222. The first physical wrapper 220 passes switching instructions to the third source FF 224, the fourth design module rlm0 and the first design module rlm1 and the second physical wrapper 222 passes switching instructions for the second design module rlm2 and the third design module rlm3. The fourth design module rlm0 further passes the switching functions to the first source FF 210 and the first sink FF 214, wherein the first source FF 210 passes the switching instructions to the third source FF 224, the second source FF 212 and the second sink FF 216. Moreover, the third source FF 224 passes switching instructions to the third sink FF 218. The first design module rlm1 passes the switching instructions to the second sink FF 216 and the third sink FF 218. The second design module rlm2 passes the switching instructions to the second source FF 212, which in turn, passes the switching functions to the first sink FF 214.

Figure 5:
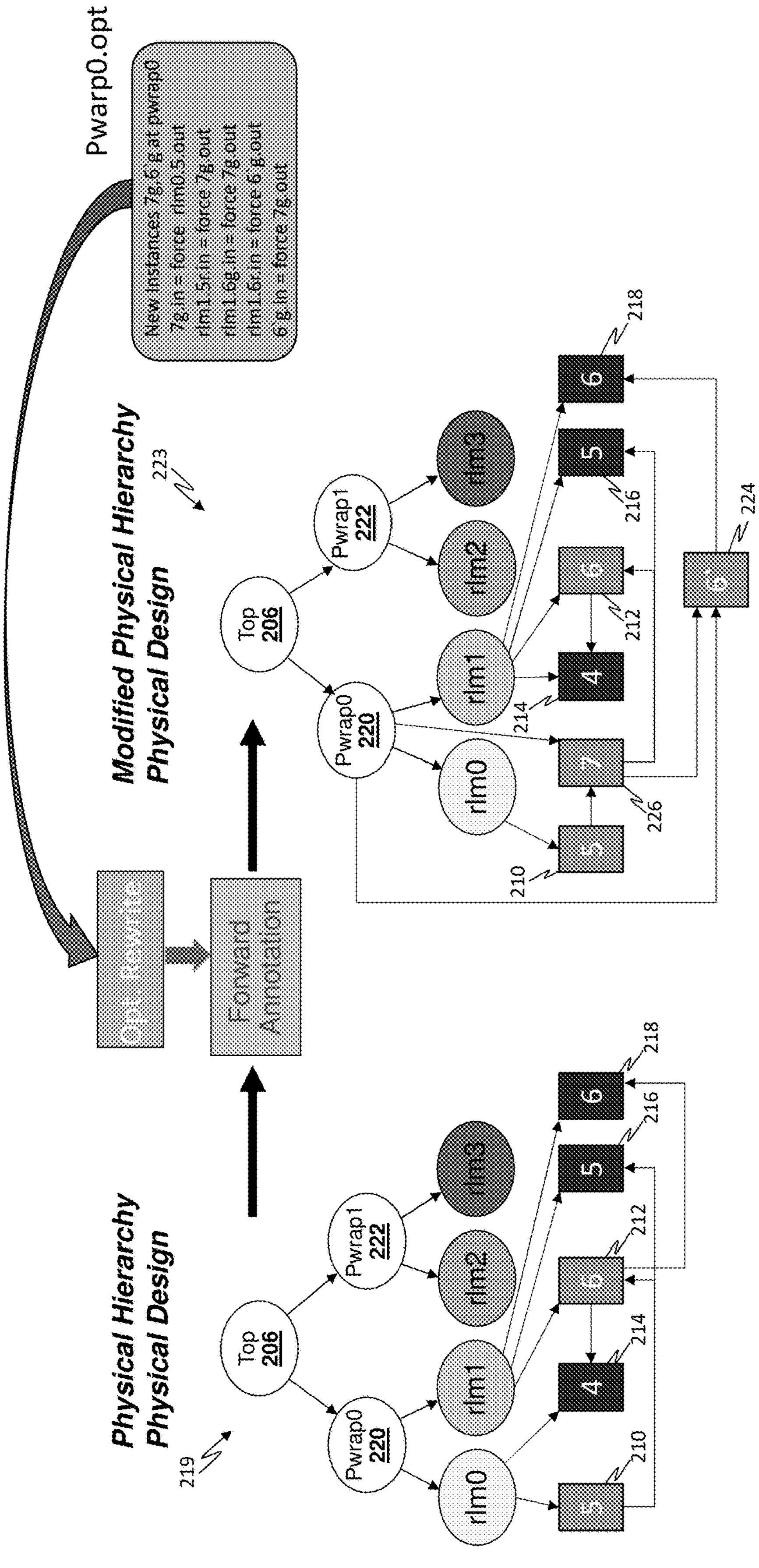
FIG. 5 is a function block diagram illustrating a physical hierarchy physical design being processed to generate a modified physical hierarchy physical design with forward annotation, in accordance with one or more embodiments of the present invention.

Referring to FIG. 5, the method 300 includes processing the optimized physical chip design 221 for forward annotation to generate a modified physical chip design 223, as shown in operational block 306. This may be accomplished by processing the optimized physical chip design 221 using a variable latency manipulation function with forward annotation to generate the modified physical chip design 223 which is consistent with the logical hierarchy functional design.

In this example, the modified physical chip design 223 generated by performing a variable latency manipulation function is shown, wherein the modified physical chip design 223 includes a third source FF 224 and a fourth source FF 226. Moreover, the contents of the top level physical hierarchy 206 is configured into the first physical wrapper 220 and the second physical wrapper 222. The first physical wrapper 220 passes the switching instructions to the third source FF 224, the fourth design module rlm0, the fourth source FF 226 and the first design module rlm1 and the second physical wrapper 222 passes the switching instructions to the second design module rlm2 and the third design module rlm3. The fourth design module rlm0 passes the switching instructions to the first source FF 210 which passes the switching instructions to the fourth source FF 226. The first design module rlm1 passes the switching instructions to the first sink FF 214, the second source FF 212, the second sink FF 216 and the third sink FF 218. Moreover, the fourth source FF 226 passes switching instructions to the second source FF 212, the second sink FF 216 and the third source FF 224, wherein the third source FF 224 passes the switching instructions to the third sink FF 218. Accordingly, the resultant modified physical chip design 223 introduces new instances of the fourth source FF 226 and third source FF 224 at first physical wrapper 220.

Figure 6:
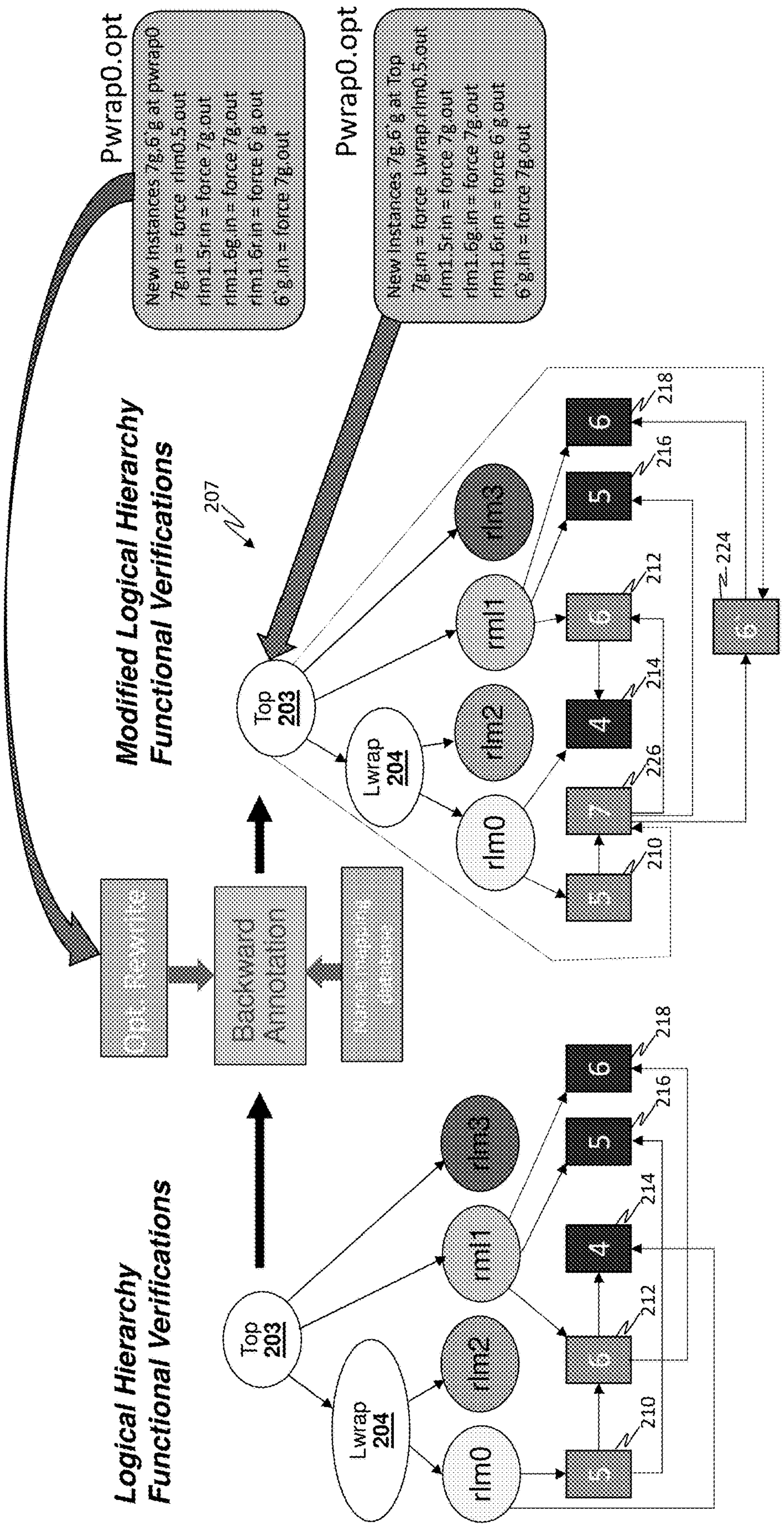
FIG. 6 is a function block diagram illustrating a logical hierarchy being processed to generate a modified logical hierarchy with backward annotation, in accordance with one or more embodiments of the present invention.

Referring to FIG. 6, the method 300 includes processing the logical hierarchy 203 consistent with the modified physical chip design 223 (See FIG. 3) to generate a modified logical hierarchy 207 which has an optimized design that accounts for backward annotation, as shown in operational block 308. As can be seen, the resultant modified top level hierarchy 203 for the modified logical hierarchy 207 includes one logical wrapper 204, a fourth design module rlm0, a first design module rlm1, a second design module rlm2, a third design module rlm3 and introduces new instances of the fourth source FF 226 and third source FF 224 at the top level logical hierarchy 203. The top level logical hierarchy 203 passes switching instructions to logical wrapper 204, first design module rlm1, third design module rlm3, fourth source FF 226 and third source FF 224. The logical wrapper 204 passes the switching instructions to the fourth design module rlm0 and the second design module rlm2.

The fourth design module rlm0 passes switching instructions to the first source FF 210 and the first sink FF 214, wherein the first source FF 210 passes switching instructions to the fourth source FF 226, which in turn passes switching instructions to the second source FF 212, the third source FF 224 and the second sink FF 216. Moreover, the first design module rlm1 passes switching instructions to the second source FF 212, the second sink FF 216 and the third sink FF 218. Additionally, the third source FF 224 passes switching instructions to the third sink FF 218 and the second source FF 212 passes switching instructions to the first sink FF 214. Accordingly, the modified logical hierarchy 207 is optimized.

Figure 7:
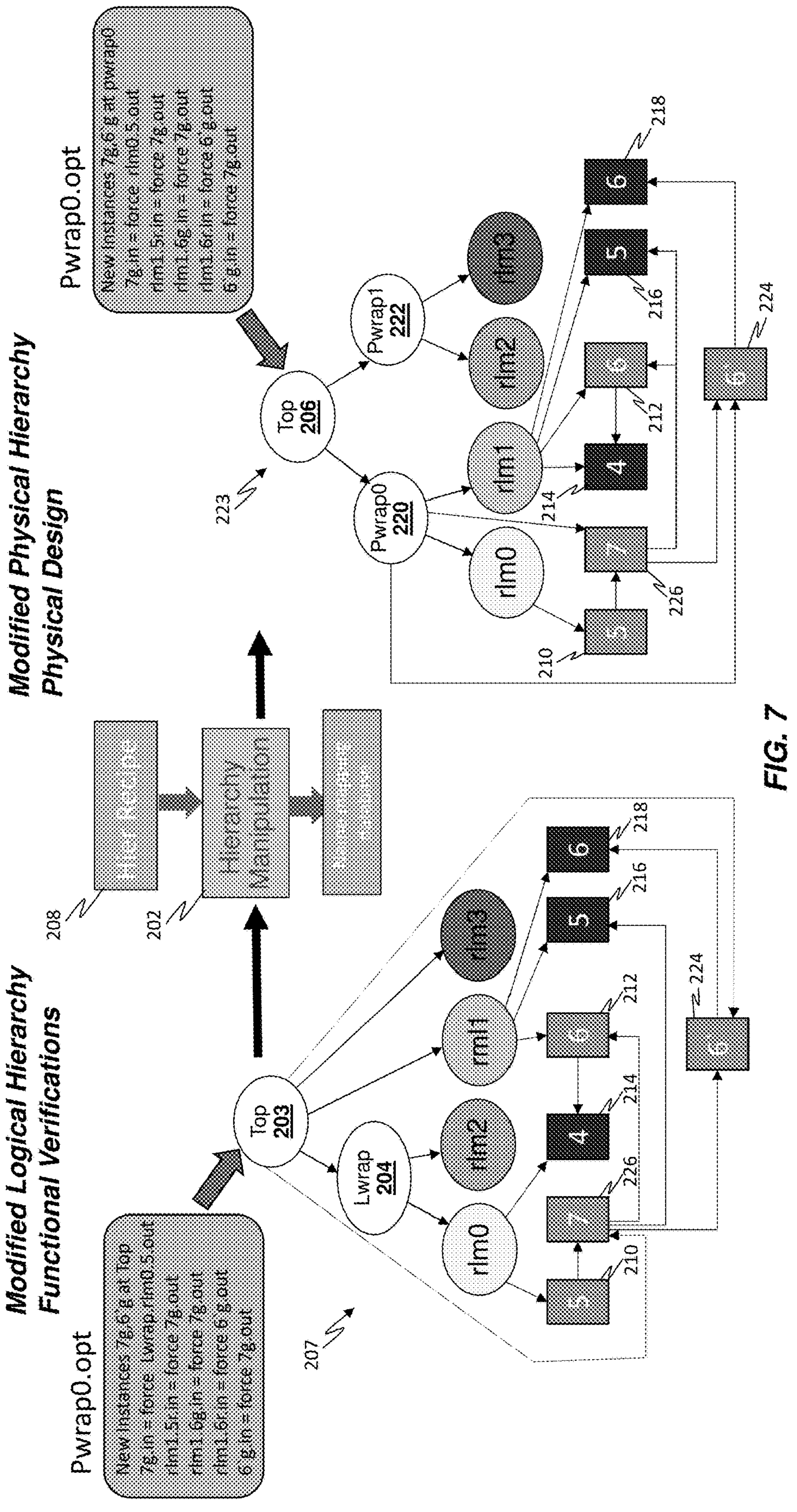
FIG. 7 is a function block diagram illustrating a final modified physical hierarchy physical design generated responsive to the modified logical design, in accordance with one or more embodiments of the present invention.

Referring to FIG. 7, the method 300 further includes verifying that the modified logical hierarchy 207 and the modified physical chip design 223 are consistent with each other, as shown in operational block 310, such that the modified physical hierarchy physical design 223 is optimized for the modified logical hierarchy 203.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein. Moreover, the embodiments or parts of the embodiments may be combined in whole or in part without departing from the scope of the invention.

What is claimed is:

1. A method for verifying Multi-Cycle Interconnect Synthesis (MCIS) optimization in an automatically generated physical hierarchy chip design, the method comprising:

introducing a logical hierarchy to a Hierarchy Manipulation Tool (HMT) to automatically generate a physical chip design, wherein the physical chip design includes a logical hierarchy and a physical hierarchy;

optimizing the physical chip design to develop an optimized physical chip design;

processing the optimized physical chip design to account for forward annotation and to generate a modified physical chip design;

processing the logical hierarchy to account for backward annotation and to generate a modified logical hierarchy; and verifying that the modified logical hierarchy and the modified physical chip design are consistent with each other.

2. The method of claim 1, wherein introducing includes the HMT processing the logical hierarchy to generate the physical chip design responsive to a group of instructions contained in a recipe file.

3. The method of claim 2, wherein optimizing includes processing the physical chip design via a variable latency manipulation function to generate the optimized physical chip design.

4. The method of claim 3, wherein optimizing the physical chip design includes generating efficient multi-cycle latch trees to maximize performance of the latch trees over multiple clock cycles responsive to the group of instructions.

5. The method of claim 3, wherein optimizing the physical chip design further includes synthesizing wires to maximize performance of the wires over multiple clock cycles responsive to the group of instructions.

6. The method of claim 1, wherein processing the optimized physical chip design includes processing the optimized physical chip design responsive to forward annotation.

7. The method of claim 1, wherein processing the logical hierarchy includes processing the logical hierarchy to generate a modified logical hierarchy that represents a function of the modified physical chip design.

8. The method of claim 7, wherein verifying includes verifying that the function of the modified physical chip design follows the modified logical hierarchy.

9. A computing system, comprising:

a machine learning system for implementing a method for verifying Multi-Cycle Interconnect Synthesis (MCIS) optimization in an automatically generated physical hierarchy chip design, the method comprising:

introducing a logical hierarchy to a Hierarchy Manipulation Tool (HMT) to automatically generate a physical chip design, wherein the physical chip design includes a logical hierarchy and a physical hierarchy;

optimizing the physical chip design to develop an optimized physical chip design;

processing the optimized physical chip design to account for forward annotation and to generate a modified physical chip design;

processing the logical hierarchy to account for backward annotation and to generate a modified logical hierarchy; and verifying that the modified logical hierarchy and the modified physical chip design are consistent with each other.

10. The method of claim 9, wherein introducing includes the HMT processing the logical hierarchy to generate the physical chip design responsive to a group of instructions contained in a recipe file.

11. The method of claim 10, wherein optimizing includes processing the physical chip design via a variable latency manipulation function to generate the optimized physical chip design.

12. The method of claim 11, wherein optimizing the physical chip design includes generating efficient multi-cycle latch trees to maximize performance of the latch trees over multiple clock cycles responsive to the group of instructions.

13. The method of claim 11, wherein optimizing the physical chip design further includes synthesizing wires to maximize performance of the wires over multiple clock cycles responsive to the group of instructions.

14. The method of claim 9, wherein processing the optimized physical chip design includes processing the optimized physical chip design responsive to forward annotation.

15. The method of claim 9, wherein processing the logical hierarchy includes processing the logical hierarchy to generate a modified logical hierarchy that represents a function of the modified physical chip design.

16. The method of claim 15, wherein verifying includes verifying that the function of the modified physical chip design follows the modified logical hierarchy.

17. A computer program product comprising a computer readable storage medium having program instructions embodied therewith, the program instructions executable by a processor to cause the processor to perform operations for implementing a method for verifying Multi-Cycle Interconnect Synthesis (MCIS) optimization in an automatically generated physical hierarchy chip design, the method comprising:

introducing a logical hierarchy to a Hierarchy Manipulation Tool (HMT) to automatically generate a physical chip design, wherein the physical chip design includes a logical hierarchy and a physical hierarchy;

optimizing the physical chip design to develop an optimized physical chip design;

processing the optimized physical chip design to account for forward annotation and to generate a modified physical chip design;

processing the logical hierarchy to account for backward annotation and to generate a modified logical hierarchy; and verifying that the modified logical hierarchy and the modified physical chip design are consistent with each other.

18. The method of claim 17, wherein introducing includes the HMT processing the logical hierarchy to generate the physical chip design responsive to a group of instructions contained in a recipe file.

19. The method of claim 10, wherein optimizing includes processing the physical chip design via a variable latency manipulation function to generate the optimized physical chip design.

20. The method of claim 11, wherein optimizing the physical chip design includes generating efficient multi-cycle latch trees and synthesizing wires to maximize performance of the latch trees and the wires over multiple clock cycles responsive to a group of instructions.

* * * * *